US008647972B1

(12) United States Patent  
Ando et al.

(10) Patent No.: US 8,647,972 B1  
(45) Date of Patent: Feb. 11, 2014

(54) MULTI-LAYER WORK FUNCTION METAL REPLACEMENT GATE (75) Inventors: Takashi Ando, Tuckahoe, NY (US); Aritra Dasgupta, Wappingers Falls, NY (US); Unoh Kwon, Fishkill, NY (US); Sean M. Polvino, Brooklyn, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/618,255

(22) Filed: Sep. 14, 2012

Related U.S. Application Data (63) Continuation of application No. 13/615,343, filed on Sep. 13, 2012.

(51) Int. Cl.  
*H01L 21/3205* (2006.01)  
*H01L 21/4763* (2006.01)

(52) U.S. Cl.  
USPC ........... 438/589; 438/268; 438/270; 438/271; 438/272; 438/592; 257/E21.294

(58) Field of Classification Search  
USPC ......... 438/268, 270, 271, 272, 585, 589, 592; 257/327, 329, 330  
See application file for complete search history.

(56) References Cited

U.S. PATENT DOCUMENTS

| | | | |
|---|---|---|---|
| 6,373,111 B1 | 4/2002 | Zheng et al. | |
| 6,858,524 B2 | 2/2005 | Haukka et al. | |
| 7,563,715 B2 | 7/2009 | Haukka et al. | |
| 7,611,943 B2 | 11/2009 | Liu | |
| 7,629,212 B2 | 12/2009 | Ramin et al. | |
| 8,294,202 B2 * | 10/2012 | Jangjian et al. | 257/327 |
| 8,298,875 B1 * | 10/2012 | Or-Bach et al. | 438/141 |
| 2010/0127336 A1 | 5/2010 | Chambers et al. | |
| 2011/0108924 A1 | 5/2011 | Suzuki et al. | |
| 2011/0241130 A1 * | 10/2011 | Chan et al. | 257/410 |
| 2012/0061772 A1 | 3/2012 | Guo et al. | |
| 2012/0248507 A1 * | 10/2012 | Liu et al. | 257/288 |
| 2012/0319179 A1 * | 12/2012 | Huang et al. | 257/288 |
| 2013/0026578 A1 * | 1/2013 | Tsau | 257/368 |
| 2013/0026579 A1 * | 1/2013 | Lu et al. | 257/369 |
| 2013/0105919 A1 * | 5/2013 | Jiang et al. | 257/411 |

OTHER PUBLICATIONS

K. Mistry, et al., "A 45nm Logic Technology with High-k+Metal Gate Transistors, Strained Silicon, 9 Cu Interconnect Layers, 193nm Dry Patterning, and 100% Pb-free Packaging," IEEE, pp. 1-4, 2007.  
Koji Inoue, et al., "Three-Dimensional Elemental Analysis of Commercial 45 nm Node Device with High-k/Metal Gate Stack by Atom Probe Tomography," Applied Physics Express, 4, pp. 1-3, 2011.

* cited by examiner

*Primary Examiner* — Angel Roman  
(74) *Attorney, Agent, or Firm* — Cantor Colburn LLP; Vazken Alexanian (57) ABSTRACT

Embodiments relate to a field-effect transistor (FET) replacement gate apparatus. The apparatus includes one or more of a substrate and insulator including a base and side walls defining a trench. A high-dielectric constant (high-k) layer is formed on the base and side walls of the trench. The high-k layer has an upper surface conforming to a shape of the trench. A first layer is formed on the high-k layer and conforms to the shape of the trench. The first layer includes an aluminum-free metal nitride. A second layer is formed on the first layer and conforms to the shape of the trench. The second layer includes aluminum and at least one other metal. A third layer is formed on the second layer and conforms to the shape of the trench. The third layer includes aluminum-free metal nitride.

19 Claims, 6 Drawing Sheets

MULTI-LAYER WORK FUNCTION METAL REPLACEMENT GATE

This application is a continuation of U.S. Non-Provisional application Ser. No. 13/615,343, entitled "MULTI-LAYER WORK FUNCTION METAL REPLACEMENT GATE", filed Sep. 13, 2012, which is incorporated herein by reference in its entirety.

BACKGROUND

The present disclosure relates to a multi-layer work function metal replacement gate, and in particular to layers of work function metals that conform to a shape of a trench structure and which are variable to adjust work function levels of a replacement gate structure.

Field-effect transistors (FETs) generate an electric field, by a gate structure, to control the conductivity of a channel between source and drain structures in a semiconductor substrate. The source and drain structures may be formed by doping the semiconductor substrate, and the gate may be formed on the semiconductor substrate between the source and drain regions. Alternatively, a source and drain structure may be formed on the substrate, and a channel may extend between the source and the drain on the semiconductor substrate. In such a structure, referred to as a finFET due to the fin-like shape of the channel, the gate structure may be formed on the channel.

The gate of a finFET, and in some non-finFETs, may be formed by a replacement gate process, or a process in which material, such as dummy material, is removed to form a trench, and the gate materials replace the removed material in the trench. In a finFET, the trench may be defined by a plurality of channels and the source and drain structures. In other FETs, as well as in finFETs, the trench may be formed by insulating separators, for example. The gate may be formed by depositing a work function metal in the trench and forming a metal gap fill on the work function metal. Titanium aluminum (TiAl) has been used as a replacement gate work function metal, but TiAl has been limited to non-conformal methods of application, such as physical vapor deposition (PVD), in which an upper surface of the deposited material does not conform to a shape of the surface on which the material is deposited, making TiAl less-than-ideal as a replacement gate work function metal. In addition, use of Al-based metal electrodes causes gate leakage current degradation due to a strong oxygen gettering effect.

SUMMARY

Exemplary embodiments include a field-effect transistor (FET) replacement gate apparatus. The apparatus includes one or more of a substrate and insulator including a base and side walls defining a trench. A high-dielectric constant (high-k) layer is formed on the base and side walls of the trench. The high-k layer has an upper surface conforming to a shape of the trench. A first layer is formed on the high-k layer. The first layer conforms to the shape of the trench. The first layer includes an aluminum-free metal nitride. A second layer is formed on the first layer and conforms to the shape of the trench. The second layer includes aluminum and at least one other metal. A third layer is formed on the second layer and conforms to the shape of the trench. The third layer includes an aluminum-free metal nitride.

Additional exemplary embodiments include a field-effect transistor replacement gate apparatus. The apparatus includes a substrate and side walls extending from the substrate to form a trench. A high dielectric constant (high-k) layer is formed on at least the substrate. A first layer is formed on the high-k layer. The first layer includes an aluminum-free metal nitride. A second layer is formed on the first layer. The second layer includes aluminum and at least one other metal. The ratio of the aluminum to the at least one other metal is a gradient with a peak located in a center region of the second layer and troughs located at ends of the second layer. The third layer is formed on the second layer. The third layer includes an aluminum-free metal nitride.

Additional features and advantages are realized through the techniques of the present disclosure. Other embodiments and aspects of the present disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

The subject matter of the disclosure is particularly pointed out and distinctly claimed in the claims at the conclusion of the specification. The forgoing and other features, and advantages of the disclosure are apparent from the following detailed description taken in conjunction with the accompanying drawings in which:

FIGS. 3A-3E illustrate a method of forming the replacement gate structure according to one embodiment, in which:

DETAILED DESCRIPTION

Conventional replacement gate work function metals suffer from gate leakage current degradation due to material types and processes for applying the materials. Disclosed embodiments relate to work function metal layers that conform to a shape of a replacement gate trench, reduce gate leakage current, and may have an adjustable work function value.

Figure 1:
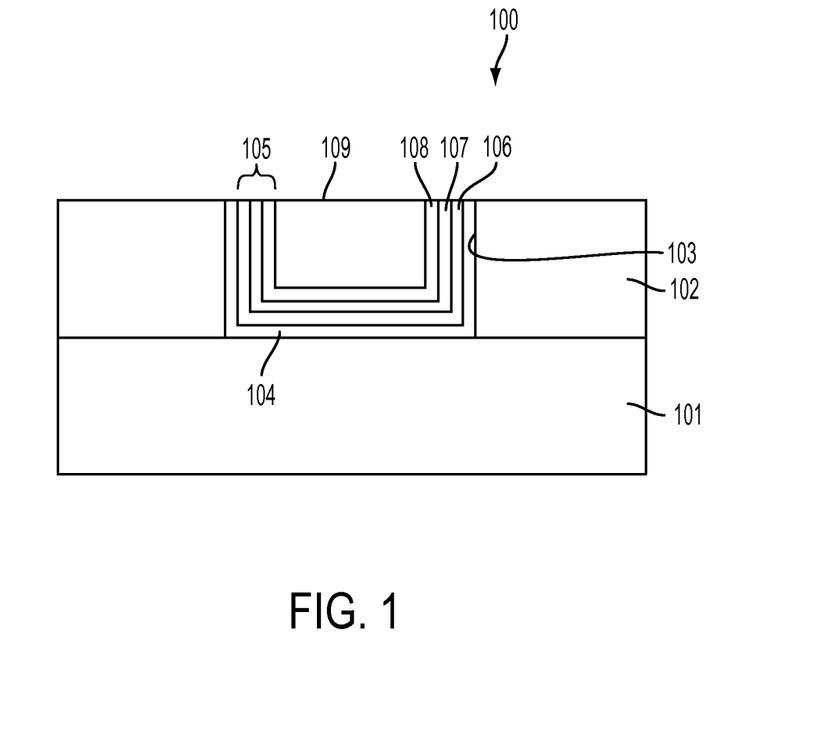
FIG. 1 illustrates a replacement gate structure according to one embodiment of the present disclosure.

FIG. 1 illustrates a replacement gate field-effect transistor (FET) structure 100 according to one embodiment of the present disclosure. The structure 100 includes a substrate 101, which may be a semiconductor substrate, such as a silicon substrate for example. The structure 100 includes side walls 102 extending from the substrate 101. In one embodiment, the substrate is a doped semiconductor substrate 101 having been doped to include source and drain regions (not shown). In such an embodiment, the side walls 102 may be insulators. In another embodiment, the structure 100 is a finFET structure, and the side walls 102 comprise channels or fins 102 extending between a source and a drain structure formed on the substrate 101. Alternatively, the side walls 102 may be the source and drain structures formed on the substrate 101. The substrate 101 and side walls 102 define a trench 103.

The structure 100 further includes a high-dielectric constant (high-k) layer 104 formed on the side walls 102 and on the substrate 101. The high-k layer 104 may be formed directly on the substrate, for example. In one embodiment, the high-k layer 104 includes hafnium (Hf), such as hafnium dioxide ($HfO_2$). In one embodiment, the high-k layer 104 is formed to conform to the shape of the trench 103. For example, the high-k layer 104 may be formed by an atomic layer deposition (ALD) process which results in a conforming layer.

The structure illustrated in FIG. 1 may correspond, for example, to a finFET in which the side walls 102 are channels extending between a source structure and a drain structure, or the side walls 102 may be the source structure and the drain structure. However, embodiments of the present disclosure also encompass planar FET embodiments in which the side walls 102 are insulation layers. In such a case, the high-k layer 104 may be formed either to conform to the side walls 102 or may be formed only at the base of the trench 104.

The structure 100 further includes a work function metal layer group 105. The work function metal layer group 105 includes a first layer 106 formed on the high-k layer 104, a second layer 107 formed on the first layer 106, and a third layer 108 formed on the second layer 107. In one embodiment, the first layer 106 is formed directly on the high-k layer 104, the second layer 107 is formed directly on the first layer 106, and the third layer 108 is formed directly on the second layer 107. In one embodiment, the first and third layers comprise an aluminum-free metal nitride layer. For example, the first and third layers 106 and 108 may be titanium nitride (TiN) or tantalum nitride (TaN). In one embodiment, the first layer 106 does not include oxygen. In one embodiment, the second layer 107 is a metal layer including aluminum and at least one other metal. For example, the second layer 107 may be made up of titanium and aluminum (TiAl) without nitrogen, or the second layer may be made up of titanium, aluminum and nitrogen (TiAlN).

The second layer 107 may be formed to have varying ratios of aluminum (Al) to another metal. Titanium (Ti) will be described in the following example for purposes of clarity. However, embodiments of the present disclosure encompass any appropriate metal in combination with aluminum. The ratio of Al:(Al+Ti) may be adjusted to adjust a work function of the structure 100. In one embodiment, a ratio of Al:(Al+Ti) is substantially constant throughout the entire second layer 107. The second layer 107 may be formed by ALD, and the ratio may be maintained constant by depositing layers of Al and Ti in a particular sequence. In one embodiment, the ratio of Al:(Al+Ti) in the second layer is a gradient having a peak at a center portion of the layer. The center portion may correspond, for example, to about +/−10% of the height of the second layer 107 from a center plane of the second layer 107. In such an embodiment, layers of Al may be deposited in an ALD process with a greater frequency when forming the center portion of the second layer 107 than when forming the end portions.

Figure 2A:
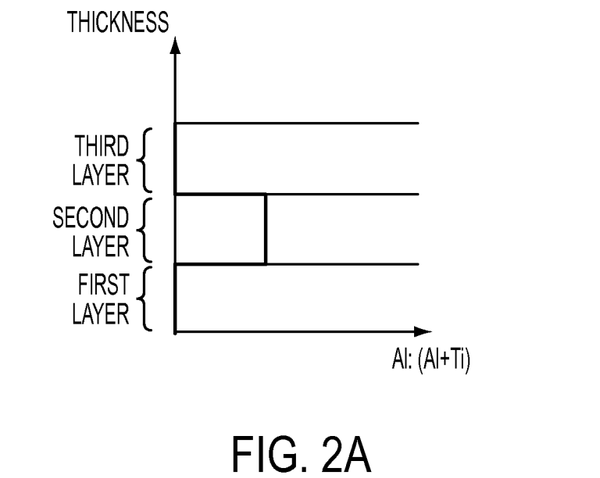
FIG. 2A illustrates a ratio of aluminum to another metal in a layer of a group of work function metals according to one embodiment.

FIGS. 2A and 2B illustrate the ratio of Al to Al+Ti according to embodiments of the present disclosure. As illustrated in FIG. 2A, in one embodiment a ratio of Al to Al+Ti is zero in regions corresponding to the first and third layers 106 and 108, since these layers include no Al. In the region corresponding to the second layer 107, the ratio of Al to Al+Ti is constant. In other words, when forming the second layer 107 by ALD, a sequence of deposition of Al and Ti layers may be maintained constant throughout the formation of the second layer 107.

Figure 2B:
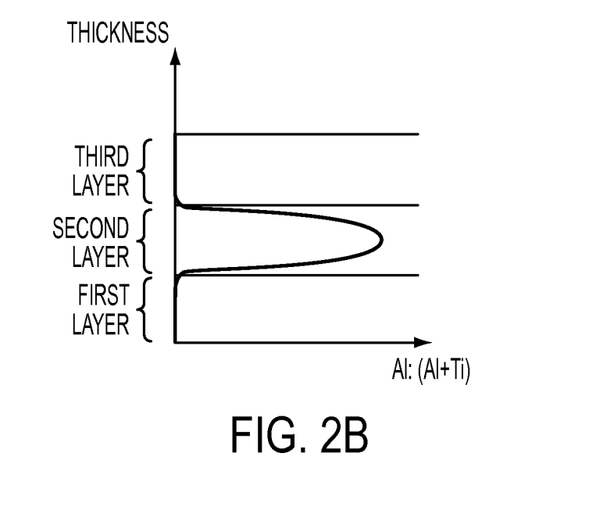
FIG. 2B illustrates a ratio of aluminum to another metal in a layer of a group of work function metals according to another embodiment.

As illustrated in FIG. 2B, in another embodiment, a ratio of Al to Al+Ti is still zero in regions corresponding to the first and third layers 106 and 108, since these layers include no Al. However, in the region corresponding to the second layer 107, the ratio of Al to Al+Ti is a gradient that increases from the edges of the second layer 107 and reaches a peak at a center region of the second layer 107. In other words, when forming the second layer 107 by ALD, a sequence of deposition of Al and Ti layers may be maintained altered so that layers of Al are deposited with increased frequency relative to layers of Ti in the center region of the second layer 107.

Referring again to FIG. 1, in addition to controlling the work function of the structure 100 based on the ratio of Al:(Al+Ti) in the second layer 107, embodiments of the present disclosure further encompass controlling the work function of the structure 100 based on a thickness of the first layer 106. In one embodiment, the thickness of the first layer 106 is formed or designed such that the work function of the work function metal layers 105 corresponds to a quarter-gap work function. Embodiments of the present disclosure further encompass controlling gate leakage current levels by controlling the thickness of the first layer 106 and the ratio of Al:(Al+Ti) in the second layer 107.

In one embodiment, the first layer 106 has a thickness between about 10 angstroms (Å) and about 30 Å, the second layer 107 has a thickness between about 10 Å and about 60 Å, and the third layer 108 has a thickness between about 10 Å and 30 Å.

The structure 100 further includes a gap fill metal 109 formed on the third layer 108. In one embodiment, the gap fill metal 109 is formed directly on the third layer 108. The gap fill metal 109 may be a non-conforming metal, or may be formed by a non-conforming process, such as PVD. Alternatively, the gap fill metal 109 may also be formed by a conforming process, such as ALD or chemical vapor deposition (CVD). In one embodiment, the gap fill metal 109 is aluminum. However, embodiments of the present disclosure encompass any conductive metal.

FIGS. 3A to 3E illustrate a process for forming a replacement gate structure 100 according to an embodiment of the disclosure. FIGS. 3A to 3E illustrate a portion of the replacement gate structure 100 around one replacement gate structure 100. However, it is understood that the described layers may be of any length and width dimensions, and multiple replacement gate structures 100 may be formed. FIG. 4 is a flow diagram of a method of forming a replacement gate structure according to an embodiment of the present disclosure. The formation of the structure 100 will be described below with reference to FIGS. 3A to 3E and 4.

In block 401 of FIG. 4, a substrate 100 is formed and side walls 102 are formed. The substrate 101 may be a semiconductor substrate or a silicon substrate. The substrate may be a doped semiconductor substrate 101 having been doped to include source and drain regions (not shown). In such an embodiment, the side walls 102 may be insulators. In another embodiment, the structure 100 is a finFET structure, and the side walls 102 comprise channels or fins 102 extending between a source and a drain structure formed on the substrate 101. Alternatively, the side walls 102 may be the source and drain structures formed on the substrate 101. The substrate 101 and side walls 102 define a trench 103.

Figure 3A:
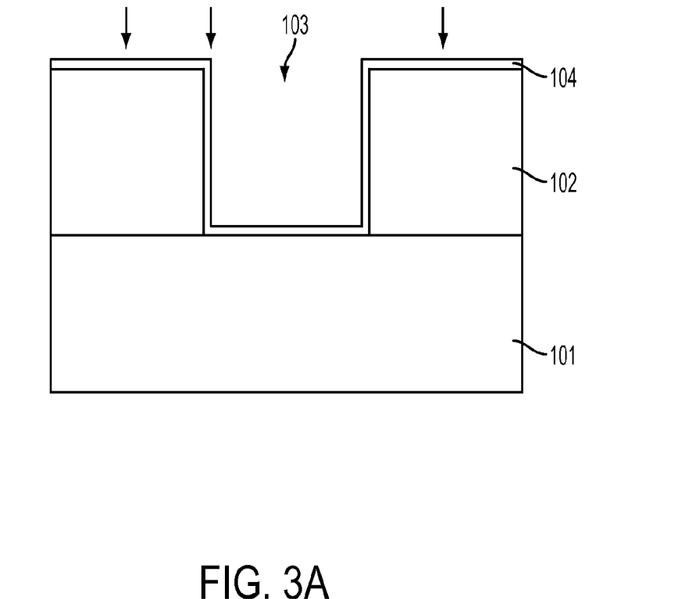
FIG. 3A illustrates forming a high-dielectric-constant material on a substrate.

In block 402 and in FIG. 3A, a high-dielectric constant (high-k) layer 104 is formed on the substrate 101 and side walls 102. The high-k layer 104 may be formed directly on the substrate 101, for example. In one embodiment, the high-k layer 104 includes hafnium (Hf), such as hafnium dioxide ($HfO_2$). In one embodiment, the high-k layer 104 is formed to conform to the shape of the trench 103. For example, the high-k layer 104 may be formed by an atomic layer deposition (ALD) process which results in a conforming layer. The ALD process is represented by arrows in FIGS. 3A to 3D.

Figure 3B:
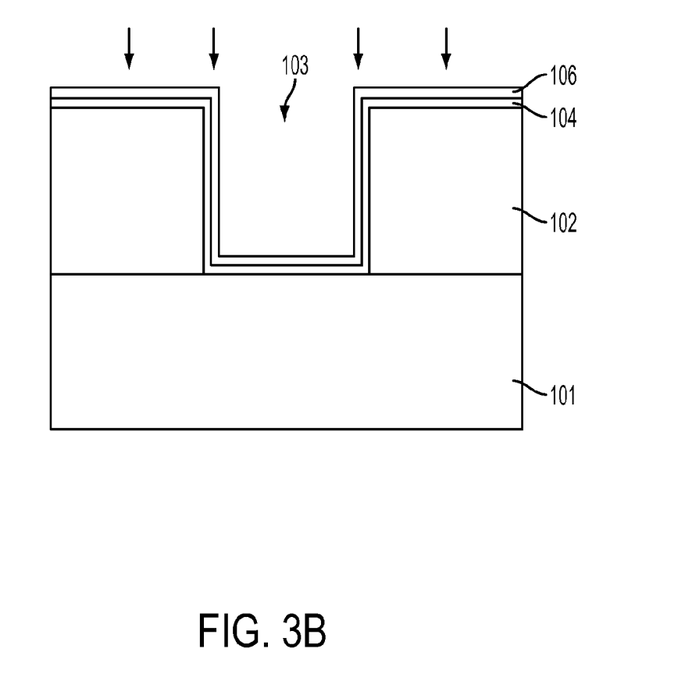
FIG. 3B illustrates forming a first layer of a group of work function metal layers.

In block 403 and in FIG. 3B, a first layer 106 is formed on the high-k layer 104. The first layer 106 may be formed directly on the high-k layer 104. The first layer 106 may be formed by a conforming process. In one embodiment, the first layer 106 is formed by ALD. The first layer may be an aluminum-free metal nitride layer. For example, the first layer 106 may be titanium nitride (TiN) or tantalum nitride (TaN). In one embodiment, the first layer 106 does not include oxygen and is not modified during fabrication of the structure 100 to include oxygen. In one embodiment, a height of the first layer 106 is adjusted to adjust a work function of the work function metal group 105 (see FIGS. 1 and 3E). In one embodiment, the thickness of the first layer 106 is formed such that the work function of the work function metal group 105 corresponds to a quarter-gap work function. In one embodiment, the first layer 106 has a thickness between about 10 Å and about 30 Å.

Figure 3C:
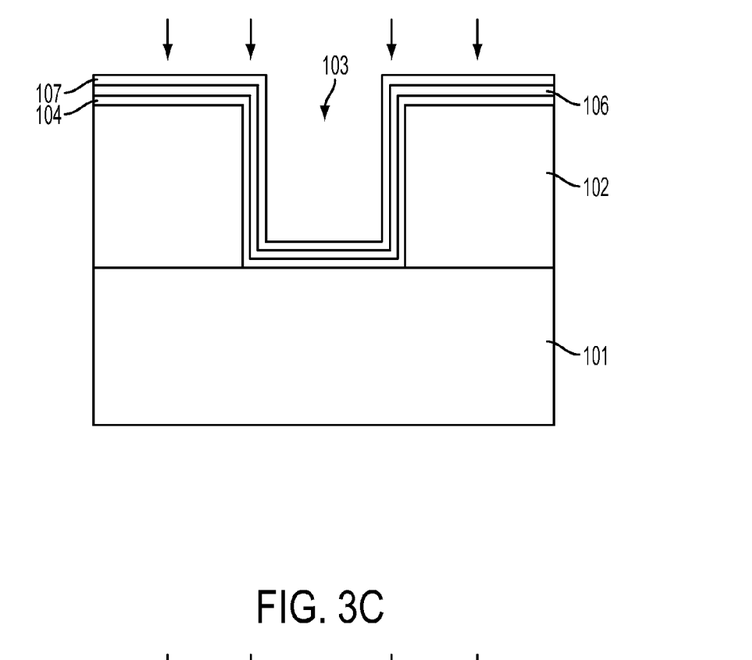
FIG. 3C illustrates forming a second layer of a group of work function metal layers.

In block 404 and in FIG. 3C, a second layer 107 is formed on the first layer 106. The second layer 107 may be formed directly on the first layer 106. The second layer 107 may be formed by a conforming process. In one embodiment, the second layer 107 is formed by ALD. In one embodiment, the second layer 107 is a metal layer including aluminum and at least one other metal. For example, the second layer 107 may be made up of titanium and aluminum (TiAl) without nitrogen. Alternatively, the second layer may be made up of titanium, aluminum and nitrogen (TiAlN). The second layer 107 may be formed by applying layers of Al and one or more additional metals in sequential atomic layers in an ALD process. In an embodiment in which the second layer 107 comprises TiAl, layers of Ti and Al may be deposited in sequence in predetermined ratios.

In the embodiment in which the second layer includes TiAl, the ratio of Al:(Al+Ti) may be adjusted to adjust a work function of the structure 100. In one embodiment, a ratio of Al:(Al+Ti) is substantially constant throughout the entire second layer 107. In other words, layers of Al and Ti are deposited by an ALD process in constant ratios. In one embodiment, the ratio of Al:(Al+Ti) in the second layer is a gradient having a peak at a center portion of the layer. The center portion may correspond, for example, to about +/−10% of the height of the second layer 107 from a center plane of the second layer 107. In such an embodiment, layers of Al may be deposited in an ALD process with a greater frequency when forming the center portion of the second layer 107 than when forming the end portions, relative to a frequency with which the Ti layers are deposited.

In one embodiment, the percentage of Al relative to Al+Ti in the second layer 107 is between about 10% and about 90%. In one embodiment, the second layer 107 is formed by depositing layers of titanium nitride (TiN) and titanium aluminum nitride (TiAlN) in a particular sequence to obtain a layer of TiAlN having a predetermined ratio of Al:Ti, or a predetermined gradient of ratios of Al:Ti throughout the second layer 107. The second layer 107 may be formed to have a thickness between 10 Å and 60 Å.

Figure 3D:
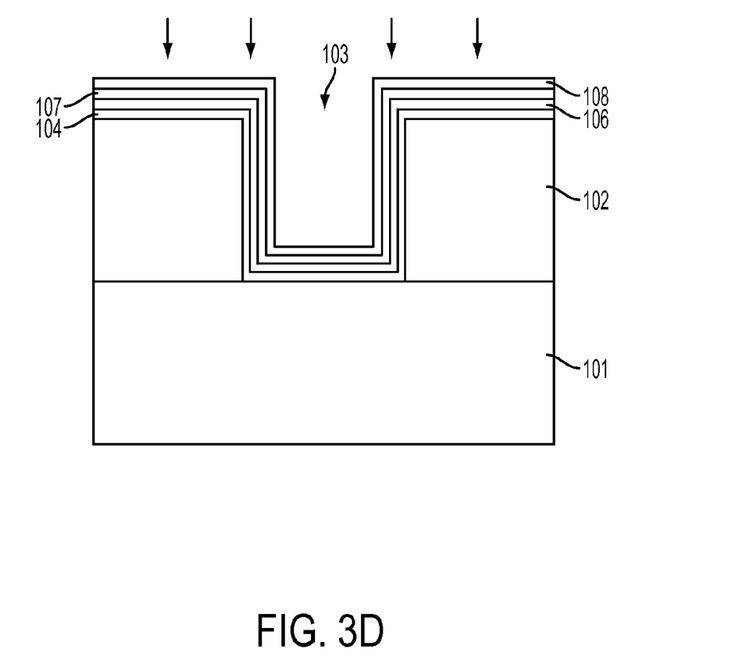
FIG. 3D illustrates forming a third layer of a group of work function metal layers.

In block 405 and in FIG. 3D, a third layer 108 is formed on the second layer 107. The third layer 108 may be formed directly on the second layer 107. The third layer 108 may be formed by a conforming process. In one embodiment, the third layer 108 is formed by ALD. The third layer may be an aluminum-free metal nitride layer. For example, the third layer 108 may be titanium nitride (TiN) or tantalum nitride (TaN). In one embodiment, the third layer 108 has a thickness between about 10 A and about 30 A. The formation of the third layer 108 may prevent undesired oxidation of the second layer 107 by air exposure.

In one embodiment, the first, second and third layers 106, 107 and 108 are formed in situ, or in a same chamber in sequential order, without exposing the chamber to external air between the deposition processes of the respective layers. In other words, since the first, second and third layers 106, 107 and 108 may all be formed by ALD, they may all be performed in the same chamber without exposing the layers to air, and undesired oxidation of the layers 106, 107 and 108 may be avoided.

Figure 3E:
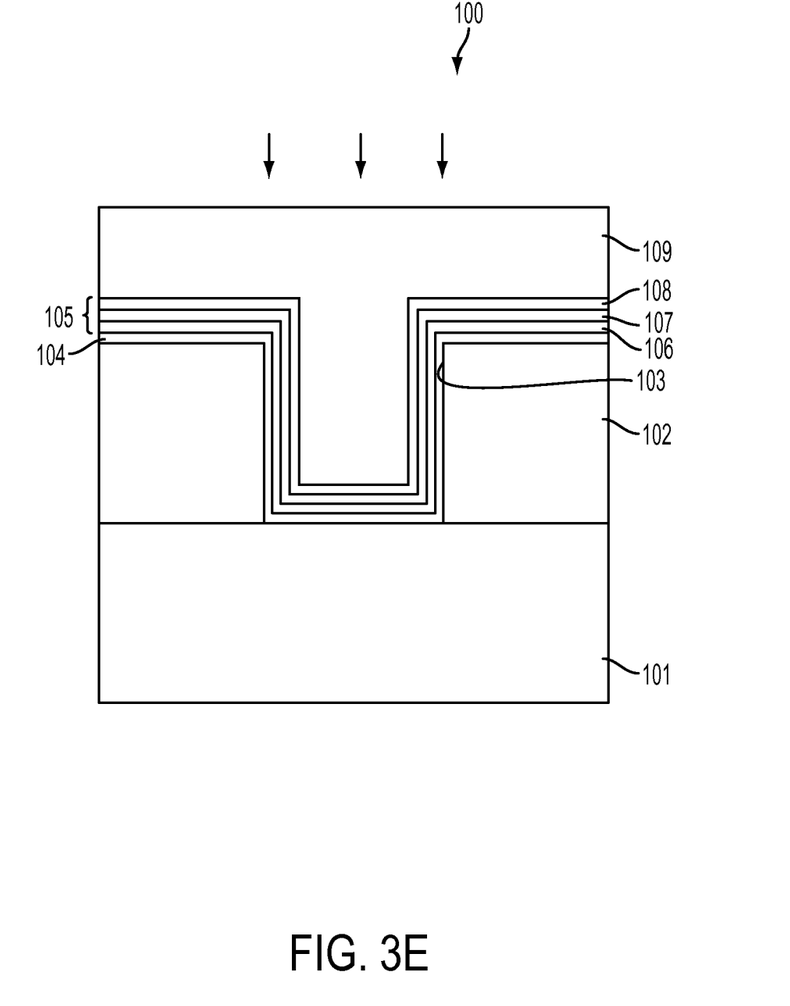
FIG. 3E illustrates forming a gap fill metal layer.
Figure 4:
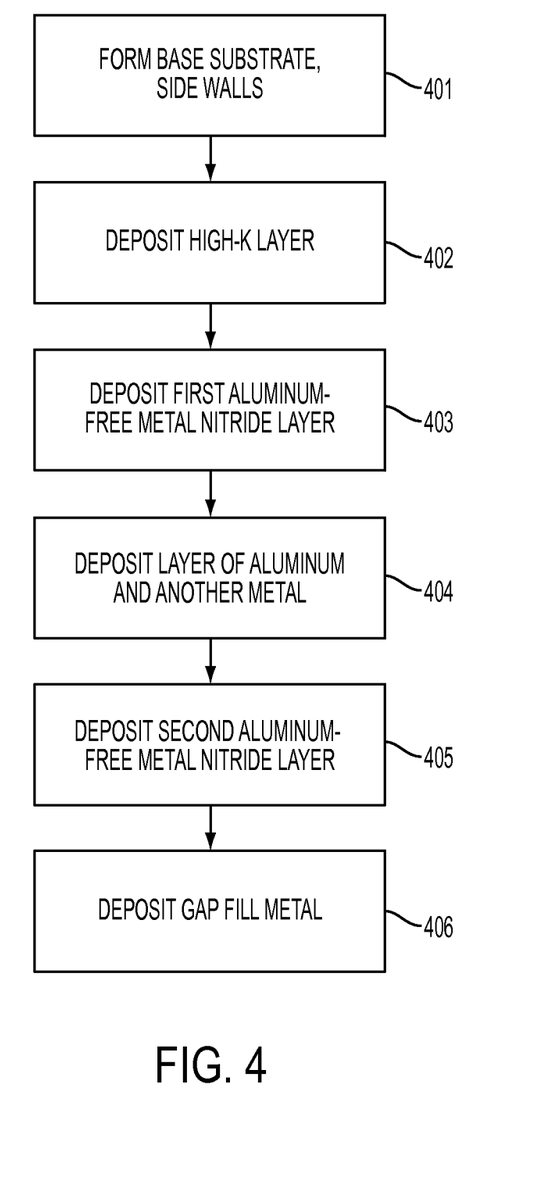
FIG. 4 illustrates a flowchart of a method for forming the replacement gate structure according to one embodiment.

In block 406 and in FIG. 3E a gap fill metal 109 is formed on the third layer 108. The gap fill metal 109 may be formed directly on the third layer 108. The gap fill metal 109 may be any conductive metal, such as aluminum or tungsten. The gap fill metal 109 may be formed in a conforming process, such as ALD, or a non-conforming process, such as PVD. In addition, a final replacement gate structure 100 may be formed by removing, or polishing off, the top surface layers down to the top surface of the side walls 102 by chemical mechanical polish, for example. The final replacement gate structure 100 is illustrated in FIG. 1.

Embodiments of the present disclosure encompass a multi-layered work function metal group of a replacement gate structure. The work function metal group includes a layer of aluminum and at least one other metal between two layers of a metal nitride that does not contain aluminum. The layers are formed on a high-k layer, and all of the layers are formed by an ALD process to conform to a shape of a substrate and side walls on which the layers are formed. The layer including aluminum and at least one other metal may have a higher concentration of aluminum towards a center of the layer relative to the edges of the layer. The concentration of aluminum may be adjusted according to predetermined designs to achieve a particular work function, and to reduce gate leakage current. In addition, the top-most aluminum-free metal nitride layer prevents undesired oxidation of the aluminum-containing layer by air exposure. In addition, the entire metal group, and the high-k layer, may be formed by ALD to be compatible with replacement gates, such as finFET structures.

The flowchart and block diagrams in the Figures illustrate the architecture, functionality, and operation of possible implementations of embodiments of the present disclosure. It is understood that in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

While exemplary embodiments of the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. A method of forming a replacement gate structure of a field-effect transistor, comprising:
    forming a high-dielectric-constant (high-k) layer on a substrate;
    forming a first layer on the high-k layer, the first layer being an aluminum-free metal nitride;
    forming a second layer on the first layer, the second layer comprising aluminum and at least one other metal, wherein forming the second layer includes depositing layers of aluminum to the at least one other metal in a sequence such that a ratio of aluminum to the at least one other metal is a gradient having a higher ratio at a center portion of the second layer and a lower ratio at ends of the second layer; and
    forming a third layer on the second layer, the third layer being an aluminum-free metal nitride.

2. The method of claim 1, wherein the substrate includes a base and side walls extending from the base, and
    wherein the high-k layer and the first, second and third layers are formed by a conforming process, such that an upper surface the high-k layer conforms to an upper surface of the base and the side walls and each of the first, second and third layers conforms to an upper surface of a respectively underlying layer.

3. The method of claim 2, further comprising forming a metal gap fill layer on the third layer to fill a gap defined by the substrate and side walls via the high-k layer, and the first, second, and third layers.

4. The method of claim 2, wherein the FET is a finFET and the side walls are at least one of source and drain structures and channels extending between the source and drain structures.

5. The method of claim 1, wherein the high-k layer includes hafnium.

6. The method of claim 1, wherein the first and third layers comprise one of titanium nitride (TiN) and tantalum nitride (TaN).

7. The method of claim 1, wherein the second layer includes titanium and aluminum (TiAl).

8. The method of claim 1, wherein the second layer does not include nitrogen.

9. The method of claim 1, wherein forming the second layer includes forming the layers of aluminum in sequence with the layers of the at least one other metal such that the layers of the aluminum are formed with greater frequency at the center portion of the second layer relative to the ends of the second layer.

10. The method of claim 1, further comprising preventing exposure of the first, second and third layers to oxygen during forming of the first, second and third layers.

11. A method of forming a replacement gate structure of a field-effect transistor, the replacement gate structure including a trench defined by a base and side walls, the method comprising:
    forming a high-dielectric-constant (high-k) layer in the trench to conform to a shape of the trench;
    forming a first layer on the high-k layer to conform to a shape of the trench, the first layer being an aluminum-free metal nitride;
    forming a second layer on the first layer to conform to a shape of the trench, the second layer comprising aluminum and at least one other metal, wherein forming the second layer includes depositing layers of aluminum to the at least one other metal in a sequence such that a ratio of aluminum to the at least one other metal is a gradient having a higher ratio at a center portion of the second layer and a lower ratio at ends of the second layer; and
    forming a third layer on the second layer to conform to a shape of the trench, the third layer being an aluminum-free metal nitride.

12. The method of claim 11, further comprising forming a metal gap fill layer on the third layer to fill a gap defined by the substrate and side walls via the high-k layer, and the first, second, and third layers.

13. The method of claim 11, wherein the FET is a finFET and the side walls are at least one of source and drain structures and channels extending between the source and drain structures.

14. The method of claim 11, wherein the high-k layer includes hafnium.

15. The method of claim 11, wherein the first and third layers comprise one of titanium nitride (TiN) and tantalum nitride (TaN).

16. The method of claim 11, wherein the second layer includes titanium and aluminum (TiAl).

17. The method of claim 11, wherein the second layer does not include nitrogen.

18. The method of claim 11, wherein forming the second layer includes forming the layers of aluminum in sequence with the layers of the at least one other metal such that the layers of the aluminum are formed with greater frequency at the center portion of the second layer relative to the ends of the second layer.

19. The method of claim 11, further comprising preventing exposure of the first, second and third layers to oxygen during forming of the first, second and third layers.

* * * * *